(12) United States Patent
Chen et al.

(10) Patent No.: US 11,894,398 B2
(45) Date of Patent: Feb. 6, 2024

(54) PHOTODETECTOR, DISPLAY SUBSTRATE, AND METHOD OF MANUFACTURING PHOTODETECTOR

(71) Applicant: BOE Technology Group Co., Ltd., Beijing (CN)

(72) Inventors: Jiangbo Chen, Beijing (CN); Fanli Meng, Beijing (CN); Fan Li, Beijing (CN); Shuo Zhang, Beijing (CN); Da Li, Beijing (CN); Zeyuan Li, Beijing (CN); Yanzhao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 153 days.

(21) Appl. No.: 17/204,057

(22) Filed: Mar. 17, 2021

(65) Prior Publication Data

US 2021/0313357 A1 Oct. 7, 2021

(30) Foreign Application Priority Data

Apr. 1, 2020 (CN) .......................... 202010251313.X

(51) Int. Cl.
*H01L 27/144* (2006.01)
*H01L 21/02* (2006.01)
*H01L 29/66* (2006.01)

(52) U.S. Cl.
CPC ...... *H01L 27/1443* (2013.01); *H01L 21/0217* (2013.01); *H01L 21/02274* (2013.01);
(Continued)

(58) Field of Classification Search
CPC ......... H01L 21/02126; H01L 21/02167; H01L 21/02274; H01L 21/02205; H01L 21/02211; H01L 21/02216; C23C 16/325
See application file for complete search history.

(56) References Cited

U.S. PATENT DOCUMENTS 8,350,621 B2 * 1/2013 Yamazaki ............ H01L 33/025
327/515
2008/0283727 A1 11/2008 Kitano et al.
(Continued)

FOREIGN PATENT DOCUMENTS

CN 101236898 A 8/2008
CN 101901838 A 12/2010
(Continued)

OTHER PUBLICATIONS

CN 202010251313.X first office action.
CN 202010251313.X second office action.

*Primary Examiner* — Monica D Harrison
*Assistant Examiner* — Andre C Stevenson
(74) *Attorney, Agent, or Firm* — IPro, PLLC

(57) ABSTRACT

A photodetector, includes a photosensitive layer, a thin film transistor, and a sensing electrode, the sensing electrode connected to one of source/drain electrodes of the thin film transistor to transmit a signal generated by the photosensitive layer to the thin film transistor; wherein the photodetector further is a hydrogen barrier layer which is disposed between the photosensitive layer and the thin film transistor and is configured to inhibit hydrogen of the photosensitive layer from entering the thin film transistor. A method of manufacturing a photodetector is further provided.

12 Claims, 8 Drawing Sheets

(52) U.S. Cl.
CPC .. *H01L 21/02488* (2013.01); *H01L 21/02565* (2013.01); *H01L 21/02631* (2013.01); *H01L 29/66969* (2013.01)

(56) References Cited

U.S. PATENT DOCUMENTS

| | | | |
|---|---|---|---|
| 2009/0152550 A1 | 6/2009 | Ohnuma et al. | |
| 2010/0096631 A1 | 4/2010 | Miyairi et al. | |
| 2016/0013243 A1* | 1/2016 | O'Rourke | H01L 31/202 257/43 |
| 2016/0035866 A1 | 2/2016 | Asano et al. | |
| 2016/0049431 A1 | 2/2016 | Taghibakhsh | |
| 2016/0365465 A1 | 12/2016 | Zheng et al. | |
| 2017/0115564 A1* | 4/2017 | Yonezawa | H05B 33/22 |
| 2017/0207275 A1 | 7/2017 | Heo et al. | |
| 2017/0250214 A1 | 8/2017 | Sekine et al. | |
| 2017/0365624 A1 | 12/2017 | Sasaki et al. | |
| 2018/0315792 A1 | 11/2018 | Sekine | |
| 2019/0019813 A1 | 1/2019 | Ren et al. | |
| 2019/0049597 A1 | 2/2019 | Tian | |
| 2019/0140101 A1 | 5/2019 | Im et al. | |
| 2019/0187305 A1 | 6/2019 | Yi et al. | |
| 2019/0341427 A1 | 11/2019 | Heo et al. | |
| 2020/0091246 A1 | 3/2020 | Li et al. | |
| 2020/0098933 A1 | 3/2020 | Tanaka | |
| 2020/0335554 A1 | 10/2020 | Wang et al. | |
| 2021/0143205 A1 | 5/2021 | Liu | |
| 2021/0215835 A1 | 7/2021 | Zhang et al. | |
| 2021/0217784 A1 | 7/2021 | Li et al. | |

FOREIGN PATENT DOCUMENTS

| | | |
|---|---|---|
| CN | 102007585 A | 4/2011 |
| CN | 102832131 A | 12/2012 |
| CN | 103489778 A | 1/2014 |
| CN | 103985764 A | 8/2014 |
| CN | 105070730 A | 11/2015 |
| CN | 105244383 A | 1/2016 |
| CN | 106653789 A | 5/2017 |
| CN | 107026237 A | 8/2017 |
| CN | 107359168 A | 11/2017 |
| CN | 108376688 A | 8/2018 |
| CN | 108807556 A | 11/2018 |
| CN | 109244103 A | 1/2019 |
| CN | 109276268 A | 1/2019 |
| CN | 109768082 A | 5/2019 |
| CN | 109786470 A | 5/2019 |
| CN | 110034135 A | 7/2019 |
| CN | 110391308 A | 10/2019 |
| CN | 110729235 A | 1/2020 |
| EP | 3499574 A1 | 6/2019 |
| JP | 2015170859 A | 9/2015 |
| KR | 20160137842 A | 12/2016 |
| TW | 200847419 A | 12/2008 |
| WO | 2019206027 A1 | 10/2019 |

* cited by examiner

PHOTODETECTOR, DISPLAY SUBSTRATE, AND METHOD OF MANUFACTURING PHOTODETECTOR

CROSS-REFERENCE TO RELATED APPLICATIONS

The present application claims priority to a Chinese patent application under CN 202010251313.X, entitled "PHOTODETECTOR, DISPLAY SUBSTRATE, AND METHOD OF MANUFACTURING PHOTODETECTOR" and filed with China National Intellectual Property Administration (CNIPA) on Apr. 1, 2020, the content of which is incorporated herein by reference in its entirety for all purposes.

TECHNICAL FIELD

Embodiments of the present disclosure relate to a photodetector, a display substrate, and a method of manufacturing the photodetector.

BACKGROUND

Photodetectors are important photoelectric sensors, and are widely used in fields of industry, national defense and medicine and in daily life. Conventional photodetectors include PIN photodetectors, PN photodetectors, and Metal-Semiconductor-Metal (MSM) photodetectors. Taking the MSM photodetectors as an example, they have advantages of rapid response, small capacitance, simple processing and easy integration, so they are widely applied in the field of photodetection. However, manufacturing process of the MSM photodetectors affects the performance of thin film transistors (TFTs), which in turn affects detection performance of the photodetectors.

SUMMARY

At least some of the present disclosure provides a photodetector. The photodetector includes a photosensitive layer, a thin film transistor, and a sensing electrode, the sensing electrode is connected to one of source/drain electrodes of the thin film transistor to transmit a signal generated by the photosensitive layer to the thin film transistor. The photodetector further includes a hydrogen barrier layer disposed between the photosensitive layer and the thin film transistor, and configured to block hydrogen in the photosensitive layer from entering the thin film transistor.

In an embodiment of the present disclosure, material for the hydrogen barrier layer includes an amorphous oxide.

In an embodiment of the present disclosure, the amorphous oxide includes at least one of indium zinc oxide (IZO), indium tin zinc oxide (ITZO), and indium gallium zinc oxide (IGZO).

In an embodiment of the present disclosure, the photodetector further includes a light-shielding pattern, the light-shielding pattern is disposed between the thin film transistor and the sensing electrode, and configured to shield at least part of light irradiating on the thin film transistor, wherein the hydrogen barrier layer is disposed between the light-shielding pattern and the photosensitive layer.

In an embodiment of the present disclosure, the hydrogen barrier layer is disposed on the light-shielding pattern, and the hydrogen barrier layer and the light-shielding pattern are formed by a single patterning process.

In an embodiment of the present disclosure, the light-shielding pattern is made of at least one of a metal material and an organic material.

In an embodiment of the present disclosure, the photodetector further includes an insulating dielectric layer, the insulating dielectric layer is disposed between the sensing electrode and the photosensitive layer, and the hydrogen blocking layer is disposed between the insulating dielectric layer and the photosensitive layer.

In an embodiment of the present disclosure, an orthographic projection of the hydrogen barrier layer on the photosensitive layer overlaps the photosensitive layer.

In an embodiment of the present disclosure, the hydrogen barrier layer is located between the sensing electrode and the photosensitive layer, and the hydrogen barrier layer is doped with an insulating material for increasing resistance.

In an embodiment of the present disclosure, the insulating material includes SiOx.

In an embodiment of the present disclosure, a thickness of the hydrogen barrier layer ranges from 10 Å to 10000 Å.

In an embodiment of the present disclosure, the photodetector further includes a substrate and a buffer layer disposed on the substrate, wherein the thin film transistor is disposed on the buffer layer.

At least one embodiment of the present disclosure further provides a display substrate including the photodetector as described above.

At least one embodiment of the present disclosure further provides a method of manufacturing a photodetector, the photodetector including a photosensitive layer, a thin film transistor, and a sensing electrode, the sensing electrode connected to one of source/drain electrodes of the thin film transistor to transmit a signal generated by the photosensitive layer to the thin film transistor, wherein the photodetector further includes a hydrogen barrier layer, the hydrogen barrier layer is disposed between the photosensitive layer and the thin film transistor, the method includes: providing a substrate; forming the thin film transistor on the substrate; forming a light-shielding pattern on the thin film transistor; forming the hydrogen barrier layer on the light-shielding pattern; and forming the photosensitive layer on the hydrogen barrier layer, wherein the method further comprises forming a buffer layer through a chemical vapor deposition process; and annealing the buffer layer; wherein excitation power of the chemical vapor deposition process is greater than or equal to 800 W and less than or equal to 950 W, and flow rate of nitrogen input in the chemical vapor deposition process is greater than or equal to 500 sccm and less than or equal to 1400 sccm.

In an embodiment of the present disclosure, the method further includes forming a thin film transistor, which includes: forming an active layer of the thin film transistor on the buffer layer through a sputtering process; and annealing the active layer; wherein a mole ratio of oxygen in the sputtering process is greater than or equal to 25% and less than or equal to 80%.

In an embodiment of the present disclosure, a temperature for annealing the active layer ranges from 150° C. to 260° C.

DETAILED DESCRIPTION OF THE EMBODIMENTS

Figure 1:
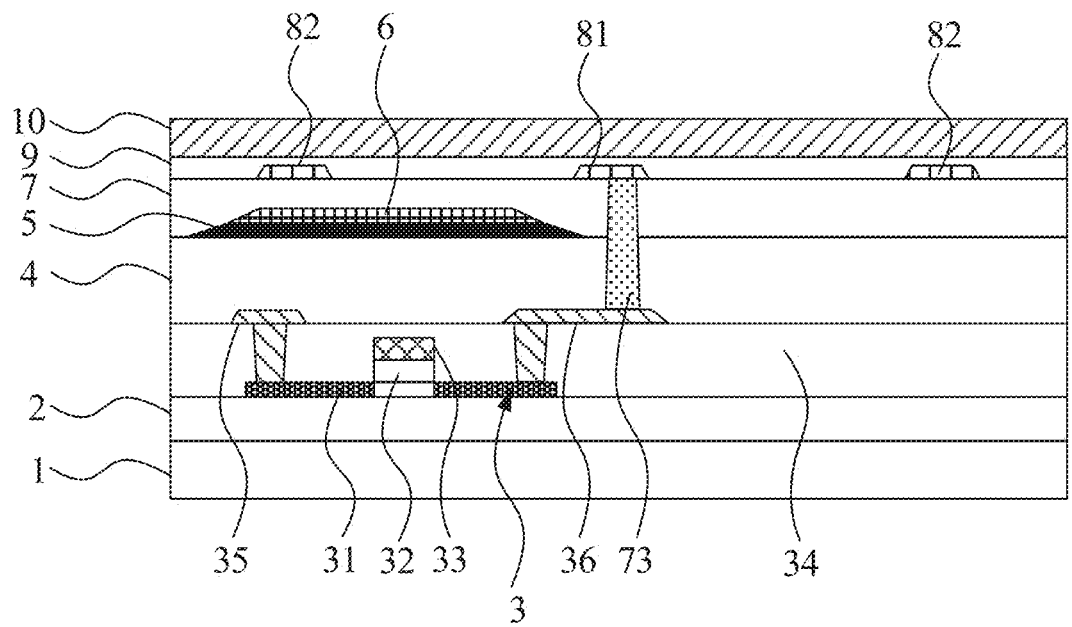
FIG. 1 is a schematic partial sectional view illustrating a photodetector according to an embodiment of the present disclosure.

Here, exemplary embodiments will be described in detail, and examples thereof are illustrated in the accompanying figures. When following description refers to the figures, unless otherwise indicated, same reference signs in different figures designate same or similar elements. Exemplary implementations described in the following exemplary embodiments do not represent all the embodiments consistent with the present disclosure. On the contrary, they are merely examples of devices consistent with some aspects of the present disclosure as defined in the appended claims.

The terms used in the present disclosure are only for the purpose of description, and are not intended to limit the present disclosure. Unless otherwise defined, the technical terms or scientific terms used in the present disclosure shall have the plain meanings understood by one of ordinary skill in the art to which this disclosure belongs. The terms such as "first", "second" and the like used in the specification and claims of the present disclosure do not denote any order, quantity, or importance, but are only used to distinguish different components. Similarly, similar words such as "a" or "one" do not mean a limit to quantity, but mean that there is at least one. The terms such as "a plurality of" or "several" mean two or more. Unless otherwise indicated, the terms such as "front", "rear", "lower" and/or "upper" are only for convenience of description, and are not limited to a position or a spatial orientation. "Including" or "comprising" and other similar terms mean that the elements or articles before "including" or "comprising" cover the elements or items listed after "including" or "comprising" and their equivalents, and do not exclude other elements or objects. Similar words such as "connected" or "connecting" are not limited to physical or mechanical connections, and may include electrical connections, whether direct or indirect. The singular forms of "a", "said" and "the" used in the specification of this disclosure and the appended claims are also intended to include plural forms, unless the context clearly indicates other meanings. It should further be understood that the term "and/or" as used herein refers to and includes any or all possible combinations of one or more associated items which are listed.

In Metal-Semiconductor-Metal (MSM) photodetectors known to the inventor, a photosensitive layer will inevitably be doped with hydrogen during its manufacturing process. If excessive hydrogen passes through other layers and enters a channel region of a Thin Film Transistor (TFT), negative shift of a threshold voltage of the thin film transistor increases, which affects performance of the thin film transistor.

At least one embodiment of the present disclosure provides a photodetector. The photodetector includes a photosensitive layer, a thin film transistor, and a sensing electrode. The sensing electrode is connected to one of source/drain electrodes of the thin film transistor to transmit a signal generated by the photosensitive layer to the thin film transistor. The photodetector further includes a hydrogen barrier layer disposed between the photosensitive layer and the thin film transistor and configured to block hydrogen in the photosensitive layer from entering the thin film transistor.

The hydrogen barrier layer may adsorb and/or block hydrogen in the photosensitive layer, thus influence of hydrogen on the threshold voltage of the thin film transistor is reduced, and performance of the thin film transistor is improved. The hydrogen barrier layer may be made of a material that has an adsorption effect on hydrogen, or may be made of a material that has a barrier effect on hydrogen, thus the hydrogen cannot permeate the hydrogen barrier layer. By disposing the hydrogen barrier layer between the photosensitive layer and the thin film transistor (especially a channel of the thin film transistor), hydrogen in the photosensitive layer may be prevented or prohibited from entering the channel of the thin film transistor, and influence of the hydrogen on a threshold voltage of the thin film transistor can be reduced, and performance of thin film transistors is improved.

The photodetector according to the embodiments of the present disclosure can be applied to MSM flat panel detection devices, and may further be used in display devices.

In an embodiment of the present disclosure, as illustrated in FIG. 1, the photodetector includes a substrate 1, a buffer layer 2 disposed on the substrate 1, a thin film transistor 3 disposed on the buffer layer 2, and a first insulating layer 4 disposed on the thin film transistor 3, a light-shielding pattern 5 disposed on the first insulating layer 4, a second insulating layer 7 disposed on the light-shielding pattern 5, an electrode layer disposed on the second insulating layer 7, an insulating dielectric layer 9 disposed on the electrode layer, a photosensitive layer 10 disposed on the insulating dielectric layer 9. In the description of the present disclosure, a direction in which the substrate 1 points to the buffer layer 2 is referred to as an upward direction, and a direction in which the buffer layer 2 points to the substrate 1 is referred to as a downward direction; the limitation "A disposed on B" may be understood as that A is disposed on a side of B in the upward direction and A contacts with B, or that A is disposed on a side of B in the upward direction and A does not contact with B, that is, there is an additional structure is disposed between A and B.

It should be noted that the photodetector may comprise a plurality of sub-units, each of the plurality of sub-units comprises a thin film transistor, a light-shielding pattern, a sensing electrode, and a bias electrode. The following only describes a structure in one sub-unit. FIG. 1 just illustrates a structure of a sub-unit, and only one sub-unit of the photodetector will be described hereinafter.

The substrate 1 may be made of glass or plastic, and is configured to support respective film layers disposed above. The buffer layer 2 may be formed on the substrate 1 through a chemical vapor deposition process or a sputtering process. The buffer layer 2 is configured to eliminate dislocations between the film layers and to improve quality of the film layers.

The thin film transistor 3 is configured to read and store an electrical signal, and includes an active layer 31, a gate 33, and source/drain electrodes, which are disposed on the buffer layer 2, a gate insulating layer 32 is disposed between the active layer 31 and the gate 33, and an interlayer dielectric layer 34 is disposed between the gate 33 and the source/drain electrodes, and the source/drain electrodes include a source electrode 35 and a drain electrode 36.

The first insulating layer 4 and the second insulating layer 7 are configured as planarization layers and may be made of an organic material, such as an organic resin. In some embodiments of the present disclosure, instead, the first insulating layer 4 and the second insulating layer 7 may be made of an inorganic material, such as silicon oxide (SiOx), silicon nitride (SiNx), or silicon oxynitride (SiON). In other embodiments of the present disclosure, one of the first insulating layer 4 and the second insulating layer 7 may be made of an inorganic material, and the other of the first insulating layer 4 and the second insulating layer 7 may be made of an organic material.

The light-shielding pattern 5 is disposed on the first insulating layer 4, and an orthographic projection of the active layer 31 on the substrate 1 at least partially overlaps an orthographic projection of the light-shielding pattern 5 on the substrate 1. In other words, the light-shielding pattern 5 may shield a part of the active layer 31 (especially a channel region) corresponding to the overlapping region to prevent the light from directly irradiating the thin film transistor, resulting in abnormal detection data and aging of the device under light. In an embodiment of the present disclosure, the orthographic projection of the active layer 31 on the substrate 1 is within the orthographic projection of the light-shielding pattern 5 on the substrate 1, that is, the light-shielding pattern 5 may shield the entire active layer 31, so as to prevent an edge of the active layer 31 from being irradiated by light and further improve light-shielding effect. In some embodiment of the present disclosure, material for the light-shielding pattern 5 is metal. In some embodiments of the present disclosure, the material for the light-shielding pattern may further be an organic resin, such as a black matrix material.

The photodetector further includes a hydrogen barrier layer 6 disposed on the light-shielding pattern 5. It should be noted that the hydrogen barrier layer 6 may adsorb or block hydrogen in the photosensitive layer, or may both adsorb and block the hydrogen. In some embodiments of the present disclosure, material for the hydrogen barrier layer 6 includes an amorphous oxide. There are many internal defects in an amorphous material, which facilitates capture and escape of hydrogen, thereby reducing or even avoiding entry of hydrogen in the photosensitive layer 10 into the thin film transistor, and further avoiding the influence of hydrogen on the performance of the thin film transistor. The amorphous oxide may include at least one of Indium Zinc Oxide (IZO), Indium Tin Zinc Oxide (ITZO), and Indium Gallium Zinc Oxide (IGZO). In some embodiments of the present disclosure, the hydrogen barrier layer 6 is made of IGZO, and a thickness of the hydrogen barrier layer 6 is about 1000 angstroms (a unit of length equal to 0.1 nanometers). In some embodiments of the present disclosure, the thickness of the hydrogen barrier layer 6 ranges from 10 Å to 10000 Å. In a case that the thickness of the hydrogen barrier layer 6 is too small (for example, less than 10 Å), effect of absorbing and/or blocking hydrogen will be poor; and in a case that the thickness of the hydrogen barrier layer 6 is too greater (for example, greater than 10000 Å), it will increase difficulty of deposition due to the excessive thickness of the layer. And in a case that the thickness of the hydrogen barrier layer 6 reaches a certain thickness, the hydrogen barrier layer 6 has a stable effect of absorbing and/or blocking hydrogen. In such a case, it will not improve capability of absorbing and blocking hydrogen any more to continue to increase the thickness of the hydrogen barrier layer 6. In some embodiments of the present disclosure, the material for the hydrogen barrier layer 6 may further comprise other amorphous materials with more internal defects.

In a case of making the light-shielding pattern 5 and the hydrogen barrier layer 6, a light-shielding pattern film layer (from which the light-shielding pattern 5 is formed through patterning) and a hydrogen barrier film layer (from which the hydrogen barrier layer 6 is formed through patterning), and the light-shielding pattern film layer and the hydrogen barrier film layer are photolithographed through a single mask and then are etched to form the light-shielding pattern 5 and the hydrogen barrier layer 6. That is to say, the light-shielding layer 5 and the hydrogen barrier layer 6 are formed through patterning with a single mask. As the light-shielding pattern 5 and the hydrogen barrier layer 6 are of different materials, etching solutions therefor are also different, so two etching processes are required. Theoretically, the larger the area and the thickness of the hydrogen barrier layer 6 are, the stronger the hydrogen adsorption and shielding capacity is. However, in the present embodiment, via holes for connecting the sensing electrode 81 to one of the source/drain electrodes are to be reserved in the hydrogen barrier layer 6, so the hydrogen barrier layer 6 is to be patterned. In order to reduce the number of required masks, the hydrogen barrier layer 6 is photolithographed together with the light-shielding pattern 5.

The electrode layer is disposed on the second insulating layer 7 and includes a sensing electrode 81 and a bias electrode 82. In a sub-unit of the photodetector, a sensing electrode 81 is disposed between two bias electrodes 82. The sensing electrode 81 is electrically connected to one of the source/drain electrodes (such as the drain electrode 36) of the thin film transistor 3 through a conductive connecting portion 73, which is located in a via hole passing through the first insulating layer 4 and the second insulating layer 7. The bias electrode 82 is configured to provide a bias voltage. Since the bias voltage is a relatively high voltage which is supplied externally, the bias electrode 82 is also referred to as a high voltage (HV) electrode.

In addition to an insulating function, the insulating dielectric layer 9 further serves as a barrier enhancement layer, thereby increasing a height and a thickness of a Schottky barrier, reducing a dark current of the device, and improving a signal-to-noise ratio and stability of the photodetector.

The photosensitive layer 10 is made of a semiconductor material sensitive to light. For example, in a case that the photodetector is configured to detect X-rays, a material sensitive to X-ray is selected, and in a case that the photodetector is configured to detect ultraviolet light, a material sensitive to ultraviolet light is selected. In implementations, a corresponding material may be selected according to actual requirements. In the present embodiment, the material for the photosensitive layer 10 includes a-Si (amorphous silicon) and other photosensitive materials. In some embodiments of the present disclosure, the photosensitive layer 10 is deposited through a plasma enhanced chemical vapor deposition (PECVD).

In operation, the bias electrode 82 first provides a bias voltage, and most of the bias voltage is applied to the insulating dielectric layer 9 with high resistance. In a case that the voltage is high enough, the insulating dielectric layer 9 may be conducted by the Fowler-Nordheim tunneling effect of electrons and an electrical signal generated by the photosensitive layer 10 may be detected by the sensing electrode 81, and may be read and stored by turning on and off the thin film transistor 3, thus, detection may be achieved.

Figure 2:
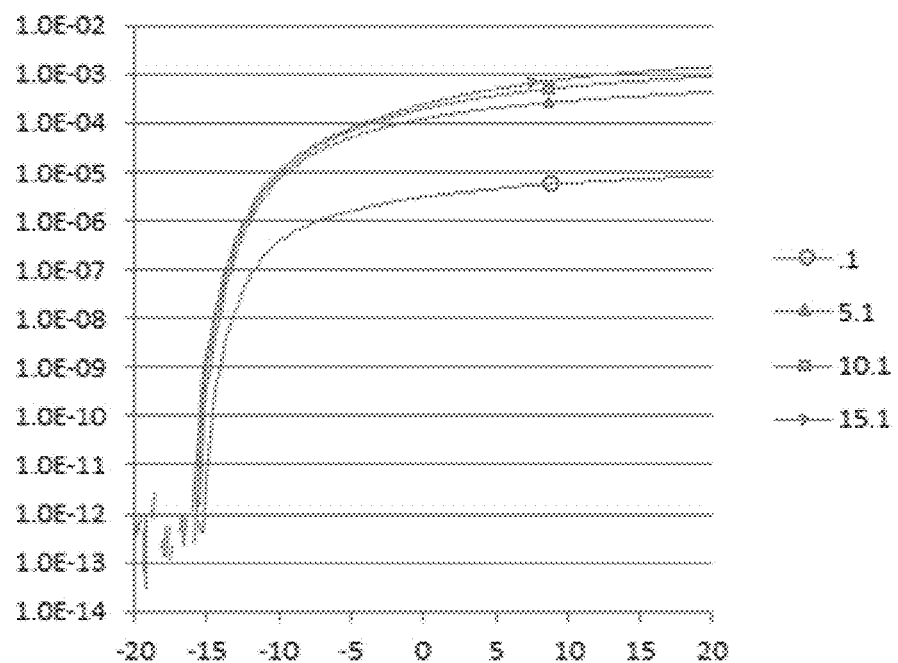
FIG. 2 illustrates a characteristic curve diagram of a thin film transistor of a photodetector known to the inventors.
Figure 3:
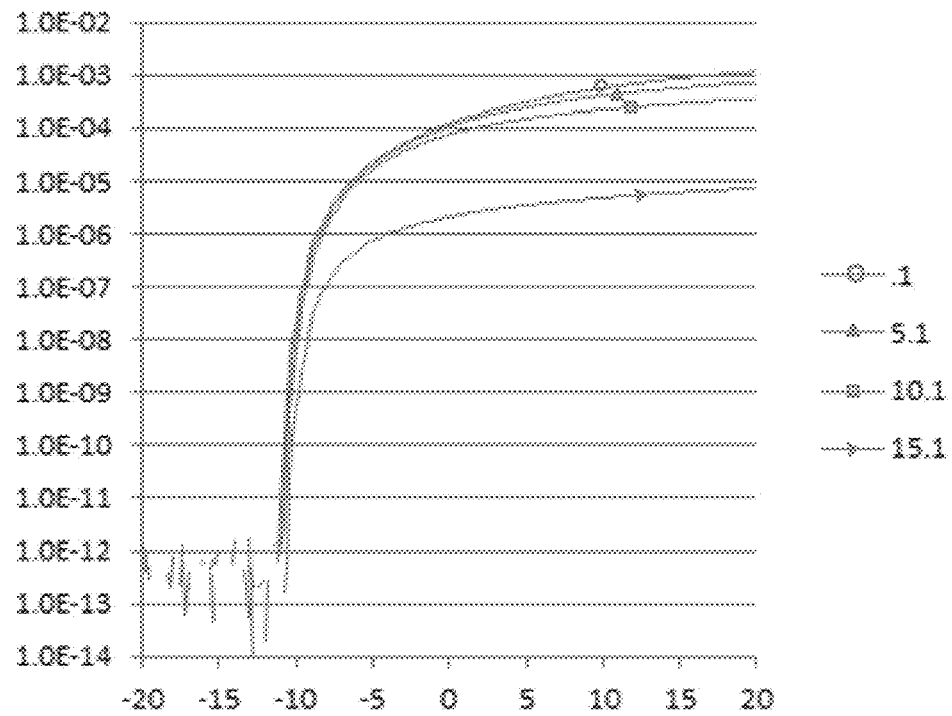
FIG. 3 illustrates a characteristic curve diagram of the thin film transistor of the photodetector illustrated in FIG. 1.

In FIGS. 2 and 3, the abscissa represents a gate voltage Vg (in Volts) of the thin film transistor, and the ordinate represents a current flowing through the thin film transistor (in Amperes), where 1.0E-6 represents $1*10^{-6}$, 1.0E-9 means $1*10^{-9}$, and so on; different curves correspond to different Vds (Vds is a voltage applied between the drain electrode and the source electrode, such as 0.1V, 5.1V, 10.1V, 15.1V); and there are breakpoints in the curves, and an area in which the breakpoints are located indicates that the current is too small to be detected by detecting device, which is equivalent to a current of 0 Ampere. Other characteristic curve diagrams of the thin film transistor are similar to those illustrated in FIGS. 2 and 3.

As illustrated in FIG. 2, in a case that the hydrogen barrier layer 6 is not provided, a threshold voltage $V_{th}$ of the thin film transistor is about −15V, and a negative drift is relatively large; as illustrated in FIG. 3, the hydrogen barrier layer 6 is provided on the light-shielding pattern 5. In this case, the threshold voltage $V_{th}$ of the thin film transistor is approximately −10V. It can be seen that the negative drift of the threshold voltage $V_{th}$ of the thin film transistor is reduced, that is, the hydrogen barrier layer 6 can effectively block and adsorb hydrogen, and reduce hydrogen entering the thin film transistor or even prevent it from entering the thin film transistor, thereby improving the performance of the thin film transistor.

Figure 4:
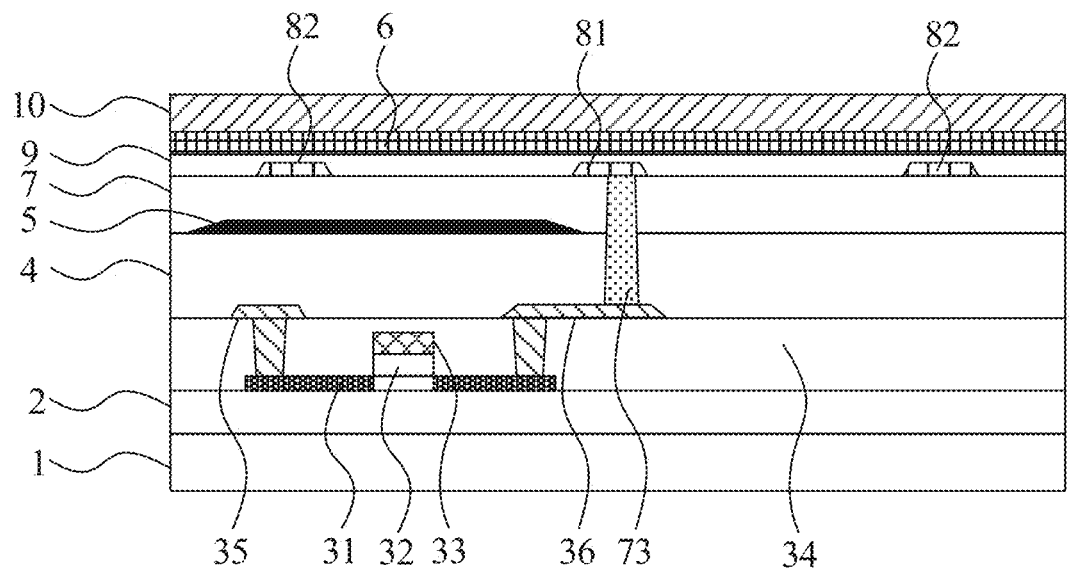
FIG. 4 illustrates a schematic partial cross-sectional view of a photodetector according to another embodiment of the present disclosure.

In another embodiment of the present disclosure, as illustrated in FIG. 4, the hydrogen barrier layer 6 is disposed between the insulating dielectric layer 9 and the photosensitive layer 10, and other structures are same as or similar to the structures in the foregoing embodiment. The hydrogen barrier layer 6 of the photodetector has a surface structure (which can be understood as covering the entire photodetector), and an orthographic projection of the hydrogen barrier layer 6 on the photosensitive layer 10 coincides with the photosensitive layer 10, that is, in the downward direction, the hydrogen barrier layer 6 can adsorb and block the hydrogen of the entire photosensitive layer 10, further reducing the influence of hydrogen on the performance of the thin film transistor. In this embodiment, the hydrogen barrier layer 6 of the photodetector is a complete film layer and does not need to be patterned, which is beneficial to simplify the manufacturing process. At the same time, the hydrogen barrier layer 6 is closer to the photosensitive layer 10 in the present disclosure with respect to the foregoing embodiment, and the hydrogen may be absorbed and shielded better. In some embodiments of the present disclosure, the hydrogen barrier layer 6 may be patterned according to actual requirement to form a plurality of units that are separated from each other and configured to block or adsorb hydrogen, which is similar to the structure of the hydrogen barrier layer as illustrated in FIG. 1.

In another embodiment of the present disclosure, difference of a structure of the photodetector as illustrated in FIG. 4 from the structure as illustrated in FIG. 4 lies in that the insulating dielectric layer (the barrier enhancement layer) is omitted. And at the same time, the hydrogen barrier layer serves as a barrier enhancement layer, the sensing electrode 81, the hydrogen barrier layer 6, and the photosensitive layer 10 are arranged adjacent to each other in sequence, and the other structures are the same or similar. In some embodiments of the present disclosure, the hydrogen barrier layer may be partially doped with an insulating material so as to increase its resistance. The doped insulating material may be SiOx (SiOx represents silicon oxide, such as SiO, $SiO_2$, etc.). The doped insulating material is $SiO_2$ in the present disclosure. In this way, the photodetector can be manufactured without additional processes, and since the hydrogen barrier layer 6 also serves as a barrier enhancement layer, it is beneficial to simplify the structure of the photodetector and reduce the manufacturing cost.

Figure 5:
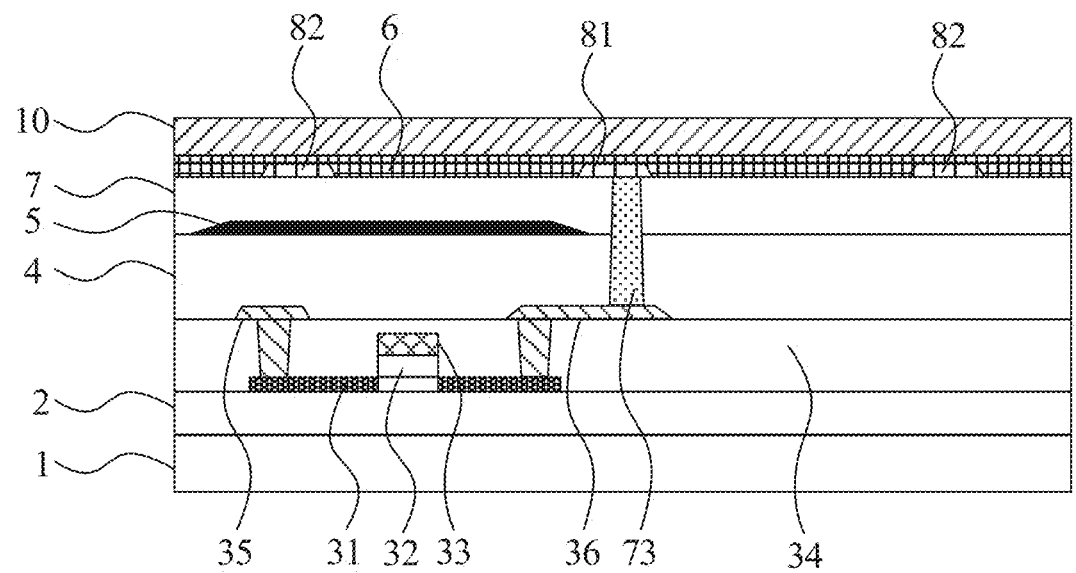
FIG. 5 illustrates a schematic partial cross-sectional view of a photodetector according to another embodiment of the present disclosure.

In the structures as illustrated in FIGS. 4 and 5, a thickness of the hydrogen barrier layer ranges from 10 Å to 2000 Å. In a case that the thickness of the hydrogen barrier layer 6 is too small (for example, less than 10 Å), the effect of absorbing and blocking hydrogen will be poor. Since the hydrogen barrier layer 6 is disposed between the photosensitive layer and the sensing electrode, in a case that the thickness of the hydrogen barrier layer 6 is too great (for example, greater than 2000 Å), a photocurrent flowing into the thin film transistor is affected due to the great thickness, thereby affecting the detection performance of photodetector.

Of course, instead, the hydrogen barrier layer may be arranged at other positions between the thin film transistor and the photosensitive layer, which will not be described in detail here.

At least one embodiment of the present disclosure further provides a photodetection device, which includes the photodetector described in any one of the foregoing embodiments and a scintillator array disposed on the photodetector. The scintillator array is configured to convert a ray (such as an X-ray and an ultraviolet ray) into visible light, and the visible light irradiates the semiconductor to generate an electrical signal which is read by the thin film transistor, thereby achieving photoelectric detection. In an embodiment of the present disclosure, material of the scintillator array is cesium iodide.

At least one embodiment of the present disclosure further provides a display substrate, the display substrate includes the photodetector described in any of the foregoing embodiments, and the display substrate is, for example, an LCD display substrate or an OLED display substrate, which is configured to form an LCD display or OLED display. The display substrate further includes other structures, such as another thin film transistor (which can be disposed on the same layer as the thin film transistor 3) for driving display and a pixel electrode (which may be disposed on a same layer as the sensing electrode 81) and other structures. It should be noted that a portion of the photosensitive layer 10 corresponding to a display area needs to be removed so as not to affect proper display of the display substrate. It is easy to understand that, since the display substrate is integrated with a photoelectric detection function, the display substrate may be configured to perform photoelectric fingerprint recognition.

At least one embodiment of the present disclosure further provides a method of manufacturing a display substrate. The photodetector includes a photosensitive layer, a thin film transistor, and a sensing electrode. The sensing electrode is connected to one of source/drain electrodes of the thin film transistor to transmit a signal generated by the photosensitive layer to the thin film transistor, wherein the photodetector further includes a hydrogen barrier layer disposed between the photosensitive layer and the thin film transistor. The method includes: providing a substrate; forming the thin film transistor on the substrate; forming a light-shielding pattern on the thin film transistor; forming the hydrogen barrier layer on the light-shielding pattern; and forming the photosensitive layer on the hydrogen barrier layer; wherein the method further includes: forming a buffer layer on the substrate by a chemical vapor deposition. In addition to forming the buffer layer, other operations may be implemented through existing processes, such as a deposition process, a photolithography process or the like, and an etching process and the like. In an embodiment of the present disclosure, forming the buffer layer includes: forming the buffer layer by a chemical vapor deposition, such as a plasma enhanced chemical vapor deposition (PECVD), and then annealing the buffer layer. Processing parameters of PECVD are as follows, and the processing parameters used in this embodiment are illustrated.

| Processing conditions | Processing parameters used in this embodiment | Conventional processing parameters |
|---|---|---|
| Temperature (° C.) | 370 | 370 |
| Material to be deposited | SiOx | SiOx |
| Time (s) | 435 | 435 |
| Excitation power (W) | 800 | 1000 |
| Distance from the mixed gas to the substrate (mil) | 710 | 710 |
| Atmosphere Pressure (mtorr) | 1500 | 1500 |
| SiH$_4$ flow (sccm) | 50 | 50 |
| N$_2$ flow (sccm) | 500 | 1500 |
| N$_2$O flow (sccm) | 2000 | 2000 |

Figure 6:
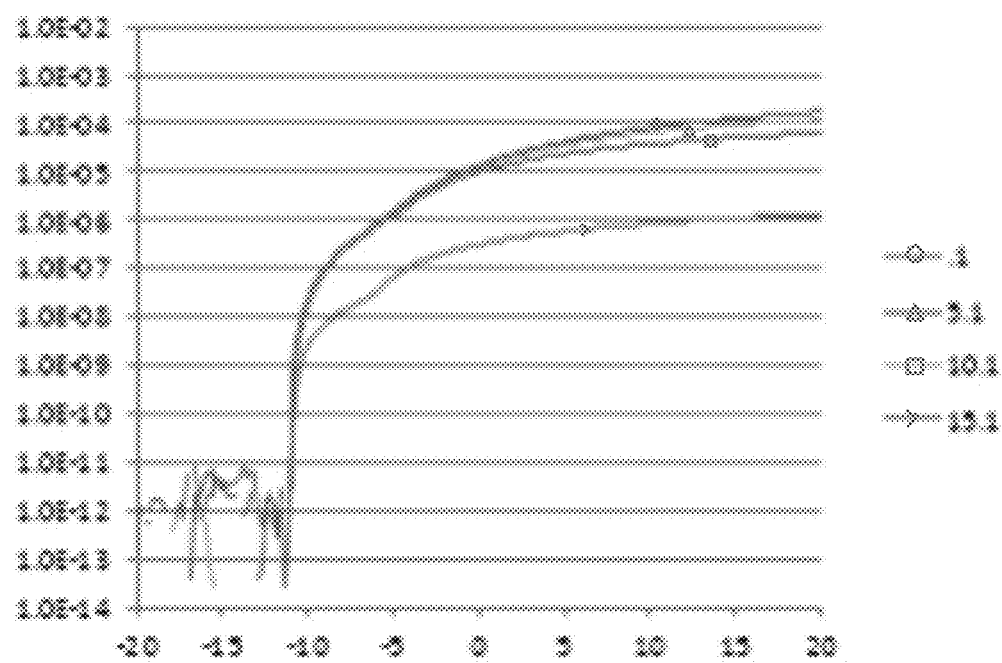
FIG. 6 illustrates a characteristic curve diagram of a thin film transistor after depositing a photosensitive layer in the photodetector, wherein a buffer layer of the photodetector is made with conventional processing parameters.
Figure 7:
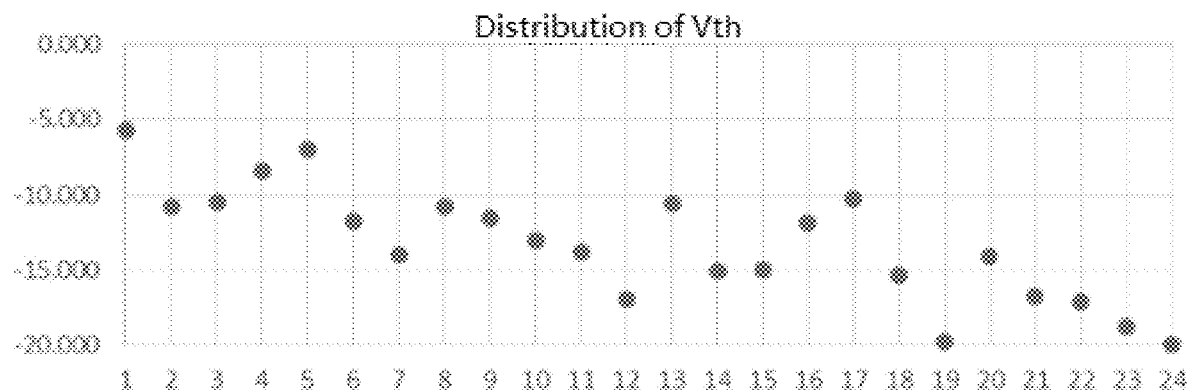
FIG. 7 is a diagram illustrating threshold voltage distribution of the thin film transistor after depositing a photosensitive layer in the photodetector, wherein a buffer layer of the photodetector is made with conventional processing parameters.
Figure 8:
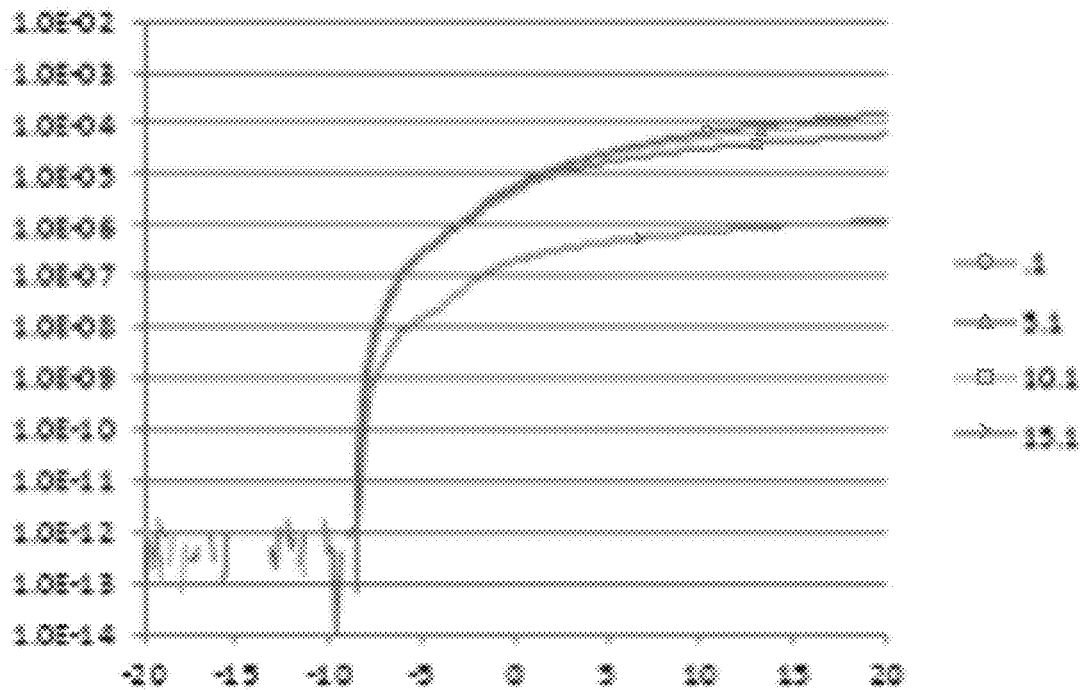
FIG. 8 illustrates a characteristic curve diagram of the thin film transistor after depositing the photosensitive layer in the photodetector according to an embodiment of the present disclosure, wherein a buffer layer of the photodetector is made with processing parameters according to an embodiment of the present disclosure.
Figure 9:
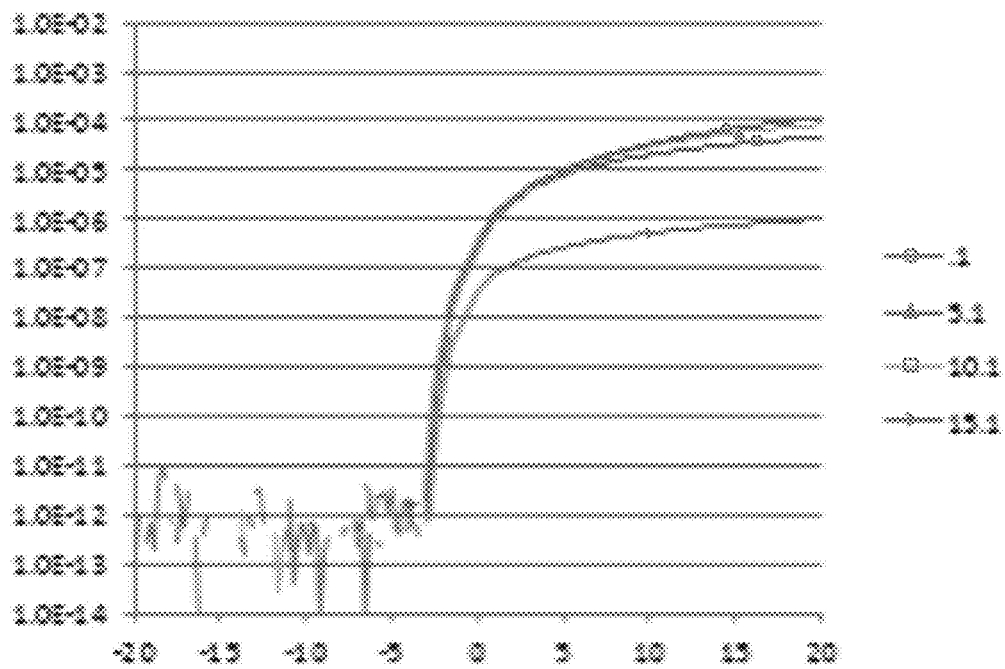
FIG. 9 illustrates a characteristic curve diagram of a thin film transistor after depositing the photosensitive layer in the photodetector and annealing, wherein a buffer layer of the photodetector is made with processing parameters according to an embodiment of the present disclosure.

The abscissa in FIG. 7 represents different measuring points (i.e., measuring points 1-24), and the ordinate represents the threshold voltage V$_{th}$ (in Volts) of the thin film transistor. Please refer to FIG. 6 and FIG. 7, in the case of conventional processing parameters, the threshold voltage V$_{th}$ of the thin film transistor is −15V. After annealing, the V$_{th}$ is about −8V. It can be seen that the negative drift is reduced after annealing but it is still relatively great. With reference to FIGS. 8 and 9, in a case of using processing parameters according to the embodiment, the negative drift of the threshold voltage V$_{th}$ of the thin film transistor is small, and V$_{th}$ returns to around 0V after annealing. This is because under normal conditions, flow rate of nitrogen is great, which results in a high density of the buffer layer. After hydrogen plasma is injected into the buffer layer, it is difficult for the hydrogen plasma to escape during annealing. After the processing parameters are changed, the buffer layer has a lower density, and it is easy for hydrogen plasma to escape after adsorption, and it is easy for V$_{th}$ to return to about 0V, which is beneficial to recovery of the threshold voltage characteristics of the thin film transistor, thereby improving the performance of the thin film transistor, improving the uniformity and stability of the photodetector, and expanding application scope of the photodetector. Moreover, since the excitation power and the nitrogen flow are reduced, it is beneficial to reduce the process requirements, and to enlarge the processing window of the device, thereby reducing the cost.

In some embodiments of the present disclosure, the nitrogen flow rate may further be values selected from a range from 500 standard cubic centimeter per minute (sccm) to 1500 sccm (not included), such as from 500 (included) to 1400 (included) sccm; correspondingly, a value of power is selected from a range from 800 W to 1000 W (not included), such as 800 W (included) to 950 W (included). For example, the flow rate of nitrogen is 1000 sccm, and the power is 900 W. In such a case, the threshold voltage V$_{th}$ of the thin film transistor is about −12V. After annealing, the V$_{th}$ is about −6V. It can be seen that adoption of these processing parameters is further beneficial to the recovery of the threshold voltage characteristics of the thin film transistor, thereby improving the performance of the TFT. In this specification, the term "value A~value B" includes its two endpoints unless otherwise specified.

In some embodiments of the present disclosure, forming the thin film transistor includes: forming an active layer of the thin film transistor on the buffer layer through a sputtering process, and then annealing the active layer. A mole ratio of oxygen in the sputtering process (a ratio of an amount in mole of oxygen to a total amount in moles of oxygen and argon) is 80%. In some embodiments of the present disclosure, the thin film transistor is, for example, an IGZO (Indium Gallium Zinc Oxide, indium gallium zinc oxide) TFT, that is, material for the active layer of the thin film transistor is IGZO. In some embodiments of the present disclosure, the active layer may be made of other semiconductor materials. In the method of manufacturing the photodetector, other film layers may be formed through existing processes. In some embodiments of the present disclosure, the buffer layer may be instead formed by the process of forming the buffer layer as described above, so as to further improve the performance of the thin film transistor.

Figure 10:
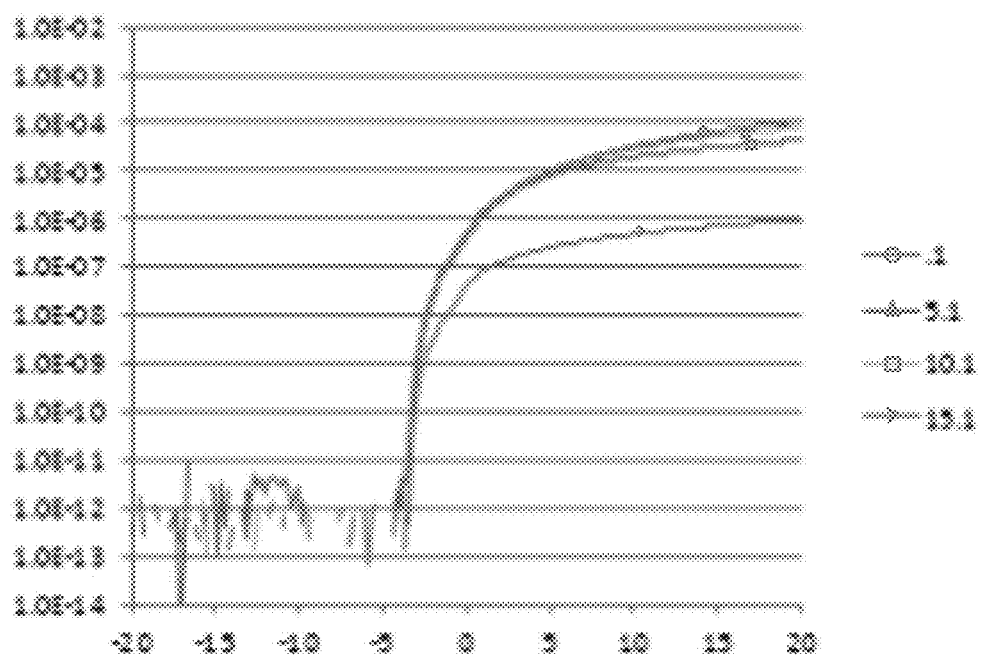
FIG. 10 illustrates a characteristic curve diagram of a thin film transistor after depositing a photosensitive layer in a photodetector and annealing at 150° C., in which a mole ratio of oxygen is 20% in a case of forming an active layer through a sputtering process.
Figure 11:
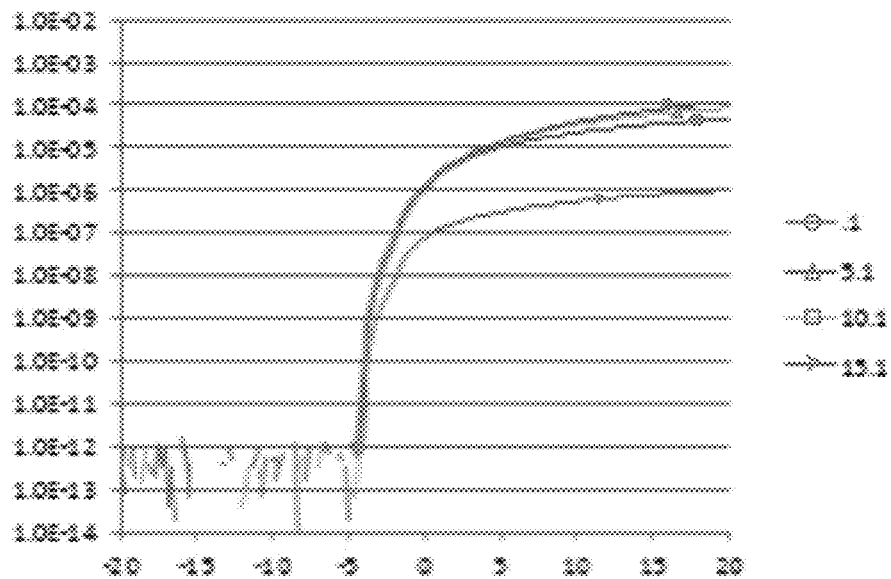
FIG. 11 illustrates a characteristic curve diagram of a thin film transistor after depositing a photosensitive layer in a photodetector according to an embodiment of the present disclosure, wherein a mole ratio of oxygen is 80% in the case of forming an active layer through a sputtering process.
Figure 12:
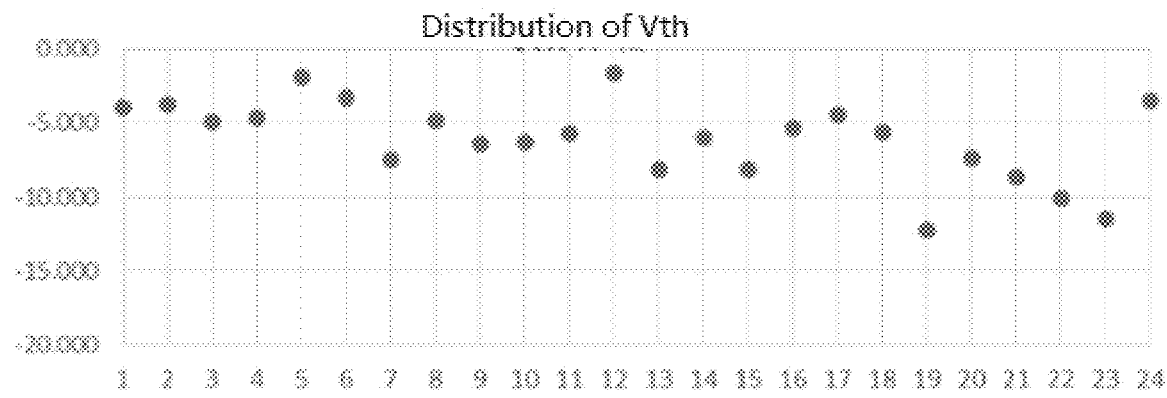
FIG. 12 illustrates a distribution diagram of a threshold voltage of a thin film transistor after depositing a photosensitive layer in a photodetector according to an embodiment of the present disclosure, wherein a mole ratio of oxygen is 80% in the case of forming an active layer through a sputtering process.
Figure 13:
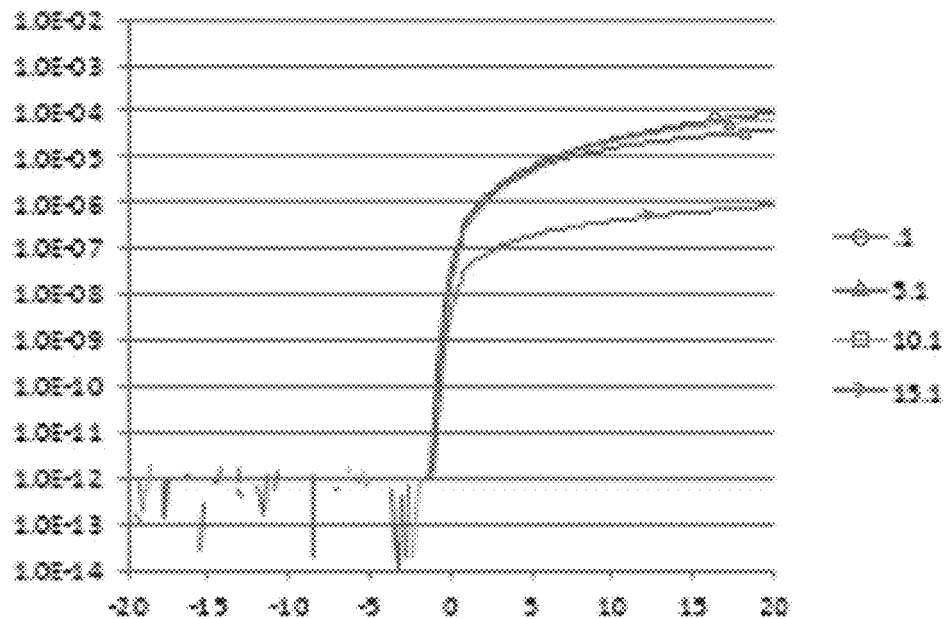
FIG. 13 illustrates a characteristic curve diagram of the photodetector according to an embodiment of the present disclosure after depositing the photosensitive layer in the photodetector and annealing at 150° C., wherein a mole ratio of oxygen is 80% in the case of forming an active layer through a sputtering process.

In the sputtering process, in a case that the mole ratio of oxygen is 20%, as illustrated in FIG. 10, through low-temperature annealing at 150° C. after deposition, the threshold voltage of the thin film transistor may return to −3V, and the $V_{th}$ still has some negative drift. And in a case that the mole ratio of oxygen in the sputtering process is 80%, as illustrated in FIG. 11 to FIG. 13, the threshold voltage $V_{th}$ of the thin film transistor after deposition of the active layer is about −5V, and the threshold voltage $V_h$ may return to about 0V after low-temperature annealing at 150° C. This is because a stoichiometric ratio of IGZO due to the high oxygen content is consistent with a designed stoichiometric ratio of a target material, and there are fewer internal oxygen vacancies and fewer overall defect states. It is difficult for hydrogen plasma to be injected or adsorbed, which is beneficial for the threshold voltage characteristics of thin film transistors to restore, so the performance of the high-oxygen IGZO TFT is more stable. In some embodiments of the present disclosure, a mole ratio of oxygen may by other values in a range from 25% to 80%, such as 50%. Correspondingly, the threshold voltage $V_{th}$ of the thin film transistor after deposition of the active layer is about −8V, and it may return to about −1V after low-temperature annealing at 150° C.

Figure 14:
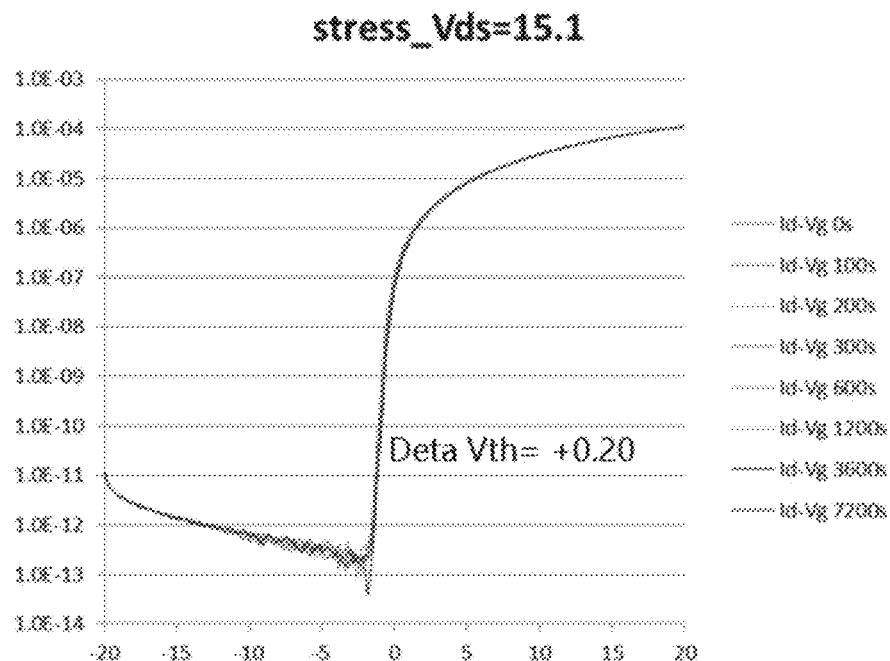
FIG. 14 illustrates a schematic diagram of a PBTS test of a thin film transistor of a photodetector according to an embodiment of the present disclosure, wherein a mole ratio of oxygen is 80% in the case of forming an active layer through a sputtering process.
Figure 15:
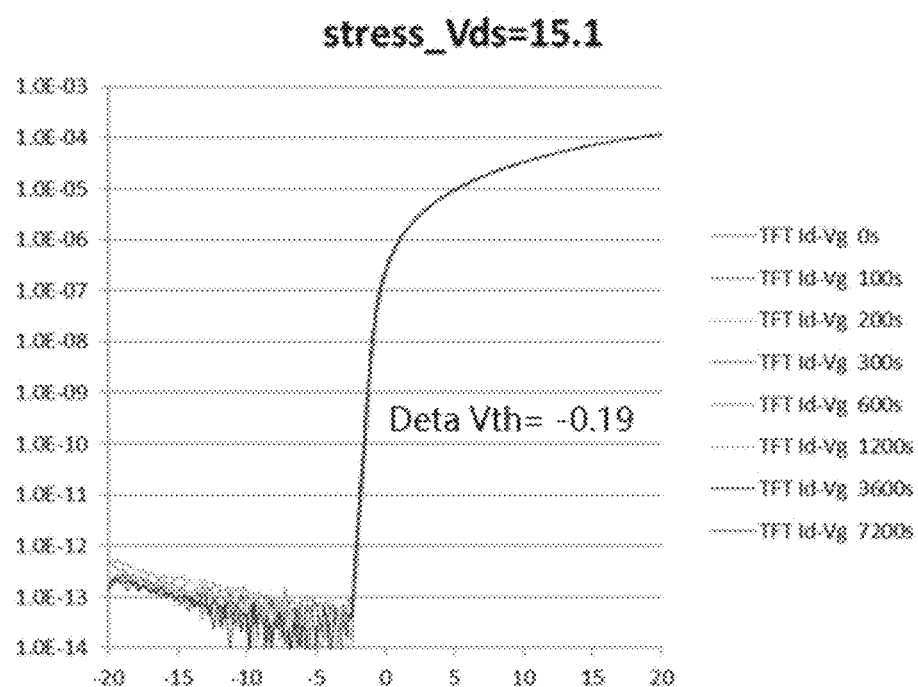
FIG. 15 illustrates a schematic diagram of an NBTS test of a thin film transistor of a photodetector according to an embodiment of the present disclosure, wherein a mole ratio of oxygen is 80% in the case of forming an active layer through a sputtering process.

Positive Bias temperature Stabilization (PBTS) or Negative Bias temperature Stabilization (NBTS) may be used to characterize the stability of TFTs. Please refer to FIG. 14 and FIG. 15. The abscissa of FIG. 14 and FIG. 15 represents a gate voltage Vg (in volts) of the thin film transistor, and the ordinate represents a current flowing through the thin film transistor (in Amperes). Respective curves represent test results in respective time periods, such as 0-100 s, 0-200 s, etc. In a case that curves in different time periods coincide with each other, it indicates that the threshold voltage $V_{th}$ of the thin film transistor tends to be stable, indicating that the stability of the thin film transistor is very good. Through PBTS test and NBTS test, it can be known that the thin film transistor has good stability in a case that a mole ratio of oxygen is 80%.

It should be noted that high-temperature annealing affects the performance of the photodetector and lead to device degradation. Therefore, annealing temperature should not be too high. Experiments show that a high temperature above 260° C. affects the performance of the photodetector. In some embodiments of the present disclosure, a temperature for annealing the active layer is 150-260° C.

Of course, a PIN (P-type semiconductor-I-type semiconductor-N-type semiconductor) photodetector may be formed in a same processing as forming the buffer layer or in a same processing as forming the thin film transistor.

In the present disclosure, by providing a hydrogen barrier layer to adsorb hydrogen in the photosensitive layer, hydrogen entering the thin film transistor is reduced or even avoided, which is beneficial to reduce the influence of hydrogen on the threshold voltage of the thin film transistor, thereby improving the performance of the thin film transistor.

What are described above are only embodiments in consistent with some aspects of the present disclosure, and are not intended to limit the present disclosure in any form. Although the present disclosure has been disclosed in the embodiments as discussed above, it is not intended to limit the present disclosure. One of ordinary skill in the art can make variants or modifications to the present disclosure, without departing from the scope of the technical solution of the present disclosure, and the variants or modifications fall into the scope of the present disclosure as defined in the appended claims.

The invention claimed is:

1. A photodetector, comprising a photosensitive layer, a thin film transistor, and a sensing electrode, the sensing electrode below the photosensitive layer and above the thin film transistor and connected to one of source/drain electrode of the thin film transistor to transmit a signal generated by the photosensitive layer to the thin film transistor;
   wherein the photodetector further comprises a hydrogen barrier layer which is disposed between the photosensitive layer and the thin film transistor and is configured to inhibit hydrogen of the photosensitive layer from entering the thin film transistor;
   wherein the photodetector further comprises a light-shielding pattern disposed between the thin film transistor and the sensing electrode and configured to block at least part of light irradiating the thin film transistor, wherein the hydrogen barrier layer is disposed above the light-shielding pattern and below the photosensitive layer.

2. The photodetector according to claim 1, wherein material for the hydrogen barrier layer comprises an amorphous oxide.

3. The photodetector according to claim 2, wherein the amorphous oxide comprises at least one of indium zinc oxide (IZO), indium tin zinc oxide (ITZO), or indium gallium zinc oxide (IGZO).

4. The photodetector according to claim 1, wherein the hydrogen barrier layer is disposed on the light-shielding pattern, and the hydrogen barrier layer and the light-shielding pattern are formed in a single patterning process.

5. The photodetector according to claim 1, wherein the light-shielding pattern is made of at least one of a metal material and an organic material.

6. The photodetector according to claim 1, further comprising an insulating dielectric layer, wherein the insulating dielectric layer is disposed between the sensing electrode and the photosensitive layer, and the hydrogen barrier layer is disposed between the insulating dielectric layer and the photosensitive layer.

7. The photodetector according to claim 6, wherein an orthographic projection of the hydrogen barrier layer on the photosensitive layer coincides with the photosensitive layer.

8. The photodetector according to claim 1, wherein the hydrogen barrier layer is disposed between the sensing electrode and the photosensitive layer, and the hydrogen barrier layer is doped with an insulating material for increasing resistance.

9. The photodetector according to claim 8, wherein the insulating material comprises SiOx.

10. The photodetector according to claim 1, wherein a thickness of the hydrogen barrier layer ranges from 10 Å to 10000 Å.

11. The photodetector according to claim 1, further comprising a substrate and a buffer layer disposed on the substrate, wherein the thin film transistor is disposed on the buffer layer.

12. A display substrate comprising the photodetector according to claim 1.

* * * * *